(12) United States Patent
Bösmüller et al.

(10) Patent No.: US 8,270,192 B2
(45) Date of Patent: Sep. 18, 2012

(54) CIRCUIT ARRANGEMENT COMPRISING A MEMORY CELL FIELD AND METHOD FOR OPERATION THEREOF

(75) Inventors: Peter Bösmüller, Graz (AT); Johannes Fellner, Pirka (AT)

(73) Assignee: Austriamicrosystems AG, Unterpremstätten (AU)

( * ) Notice: Subject to any disclaimer, the term of this patent is extended or adjusted under 35 U.S.C. 154(b) by 65 days.

(21) Appl. No.: 12/515,196

(22) PCT Filed: Nov. 14, 2007

(86) PCT No.: PCT/EP2007/062348
§ 371 (c)(1),
(2), (4) Date: Nov. 12, 2009

(87) PCT Pub. No.: WO2008/059001
PCT Pub. Date: May 22, 2008

(65) Prior Publication Data
US 2010/0061131 A1 Mar. 11, 2010

(30) Foreign Application Priority Data
Nov. 15, 2006 (DE) .......................... 10 2006 053 902

(51) Int. Cl.
*G11C 5/02* (2006.01)
(52) U.S. Cl. ........................................................ 365/51
(58) Field of Classification Search ...................... 365/51
See application file for complete search history.

(56) References Cited

U.S. PATENT DOCUMENTS

| 5,384,746 | A | 1/1995 | Giolma |
| 6,141,247 | A | 10/2000 | Roohparvar et al. |
| 6,208,549 | B1 | 3/2001 | Rao et al. |
| 6,462,985 | B2 | 10/2002 | Hosono et al. |
| 6,876,594 | B2 | 4/2005 | Griesmer et al. |
| 7,091,564 | B2 | 8/2006 | Hasegawa |
| 2004/0008539 | A1 | 1/2004 | Pascucci |
| 2005/0185468 | A1* | 8/2005 | Hosono et al. ........... 365/185.22 |
| 2005/0212086 | A1 | 9/2005 | Unterleitner |
| 2006/0101301 | A1* | 5/2006 | Nagao et al. .................. 713/600 |
| 2006/0215471 | A1* | 9/2006 | Tran .............................. 365/205 |
| 2006/0221712 | A1* | 10/2006 | Lowrey et al. ............ 365/189.01 |
| 2006/0245272 | A1* | 11/2006 | Hartono et al. ........... 365/189.07 |

FOREIGN PATENT DOCUMENTS
WO WO 2006/036907 4/2006

OTHER PUBLICATIONS

J. Fellner et al., "Lifetime Study for a Poly Fuse in a 0.35μM Polycide Cmos Process", IEEE IRPS 2005, San Jose, California, Apr. 17-21, 2005, IEEE Catalog No. 05CH37616, ISBN: 0-78038803-8, Lib. of Congress Nr. 82-640313, pp. 446-449.

* cited by examiner

*Primary Examiner* — Hoai V Ho
*Assistant Examiner* — Min Huang
(74) *Attorney, Agent, or Firm* — Cozen O'Connor

(57) ABSTRACT

A circuit arrangement comprises a memory cell array (2) with at least one memory circuit (99). The memory circuit (99) comprises one non-volatile memory cell (98) inserted in a first current path (106) between a supply voltage terminal (9) and a reference potential terminal (8), and a volatile memory cell (97) inserted in a second current path (107) between the supply voltage terminal (9) and the reference potential terminal (8). The volatile memory cell (97) is coupled to the non-volatile memory cell (98) for reading the non-volatile memory cell (98).

11 Claims, 3 Drawing Sheets

CIRCUIT ARRANGEMENT COMPRISING A MEMORY CELL FIELD AND METHOD FOR OPERATION THEREOF

RELATED APPLICATIONS

This is a U.S. national stage under 35 USC §371 of application No. PCT/EP2007/062348, filed on Nov. 14, 2007.

This application claims the priority of German Patent Application No. 10 2006 053 902.8 filed Nov. 15, 2006 the entire content of which is hereby incorporated by reference.

FIELD OF THE INVENTION

The present invention relates to a circuit arrangement comprising a memory cell array, and a method for operating a circuit arrangement comprising a memory cell array.

BACKGROUND OF THE INVENTION

A memory can include a memory cell array with non-volatile memory cells for storing information such as serial numbers or trimming adjustments of analog circuits in a semiconductor body.

Document U.S. Pat. No. 6,876,594 shows an integrated circuitry with a cell array comprising programmable fuses.

Document U.S. Pat. No. 6,462,985 describes a non-volatile semiconductor memory with electrically re-writable non-volatile memory cells. Defective memory cells are replaced by redundant circuitry parts.

Document U.S. Pat. No. 5,384,746 deals with a circuitry for storing and retrieving information. A cell comprises a fuse and a test fuse.

Document US 2005/0212086 describes a Zener diode for storing information.

The Document "Lifetime Study for a Poly Fuse in a 0.35 µm Polycide CMOS Process", J. Fellner, P. Bösmüller, H. Reiter, conference transcript IEEE International Reliability Physics Symposium, Apr. 17-21, 2005, pages 446-449, describes a fuse comprising polysilicon and silicide layers.

SUMMARY OF THE INVENTION

It is an object of the present invention to provide a circuit arrangement comprising a memory cell array, as well as a method for operating a circuit arrangement comprising a memory cell array, which allow for quick reading of information stored in the memory cell array.

In one embodiment, a circuit arrangement comprises a memory cell array. The memory cell array has at least one memory circuit. The memory circuit comprises a non-volatile memory cell as well as a volatile memory cell. The non-volatile memory cell and the volatile memory cell are coupled to each other. The non-volatile memory cell is inserted in a first current path between a supply voltage terminal and a reference potential terminal. The volatile memory cell is inserted in a second current path between the supply voltage terminal and the reference potential terminal. The non-volatile memory cell has a non-volatile memory element. The coupling of the volatile memory cell with the non-volatile memory cell is provided for reading and programming the non-volatile memory element.

Information can be stored in the non-volatile memory cell by means of the non-volatile memory element. The information stored in the non-volatile memory cell can be read out and stored in the volatile memory cell.

For the purpose of providing an item of information within a short time, the information can be advantageously made available by the circuit arrangement using the volatile memory cell which, when compared to the non-volatile memory cell, can be read out more quickly.

In one embodiment the volatile memory cell comprises first and second inverters provided in feedback arrangement, as well as an address transistor inserted between an input of the first inverter and a bit line.

In a preferred embodiment the volatile memory cell comprises the first and second inverters, the address transistor as well as an additional address transistor which is inserted between an output of the first inverter and an inverted bit line. According to the preferred embodiment, the volatile memory cell is thus realized as a memory cell with six transistors.

In one embodiment, the circuit arrangement has a direct output which is coupled to an output of the first inverter of the volatile memory cell. According to this embodiment, a direct output signal is continuously provided at the direct output of the circuit arrangement and can be tapped at the output of the first inverter. The direct output signal can be provided independently of the clock. The direct output signal corresponds to the information which is stored in the non-volatile memory cell. As an alternative, a signal can be continuously provided as the direct output signal at the direct output of the circuit arrangement, which is inverted to a signal at the output of the first inverter. The output of the first inverter can be connected to the direct output via a buffer. The buffer can include at least one inverter. The direct output of the circuit arrangement can comprise several parallel lines. By means of the direct output of the circuit arrangement, information can be advantageously provided constantly and independent of an address decoding. The direct output signal can be permanently used, for instance, for a trimming adjustment.

In one embodiment, the circuit arrangement comprises an address input and a data output at which information is provided which can be read out of the memory cell array according to the addresses pending on the address input. The address input as well as the data output may have several lines. Information can also be referred to as data.

In one embodiment, a comparator is coupled between the non-volatile memory cell and the volatile memory cell. The memory circuit can comprise a reading transistor coupling the non-volatile memory cell with a measuring line. A comparator input of the comparator is preferably connected to the measuring line of a memory circuit. A comparator output of the comparator is preferably connected to the bit line.

In one embodiment, the comparator is realized for comparing a measuring signal of the measuring line with a threshold value. In a preferred embodiment the comparator holds several threshold values and is designed for a selective comparison of the measuring signal of the measuring line with several threshold values. The comparator is realized for the selective comparison of the measuring signal of the measuring line with one of several threshold values. The threshold values may be predefinable. Thus, a value of the non-volatile memory cell, in particular a value of the non-volatile memory element, can be advantageously compared with several threshold values. The non-volatile memory cell can be advantageously tested in such a manner that it exhibits the same logic state throughout its lifetime despite a possible long-term drift of its resistance value.

The non-volatile memory cell may include a reversibly programmable memory element. In an alternative embodiment, the non-volatile memory cell can comprise an irreversibly programmable memory element.

The non-volatile memory element may be realized as a resistor wherein a programming current irreversibly enlarges the resistance value of the non-volatile memory element. Alternatively, the non-volatile memory element may be a fuse which is programmed by means of a laser beam. The non-volatile memory element preferably is realized as a fuse comprising a resistor which can be melted by a programming current.

In an alternative embodiment the non-volatile memory element can be realized as an antifuse element wherein the resistance value can be irreversibly reduced by a programming current. The antifuse element can be realized as a diode, in particular a Zener diode.

The non-volatile memory element can be referred to as a one time programmable element, in short OTP element.

The circuit arrangement can be formed on a semiconductor body. It may be realized in a bipolar integration technology. Preferably, it can be produced by means of a complementary metal oxide semiconductor integration technology, abbreviated as CMOS integration technology, and have switches and transistors which are realized as metal oxide semiconductor field effect transistors, in short MOSFETs.

The circuit arrangement can be used for a permanent storage of information. The information can include a serial number or an identification number for the semiconductor body. As an alternative, the circuit arrangement can be intended for storing a trimming adjustment of an analog circuit, in particular an analog/digital or digital/analog converter. It may serve for repairing a Random Access Memory, in short RAM, by accessing redundant cells or columns instead of defect rows or columns.

In one embodiment, a method for operating a circuit arrangement comprising a memory cell array provides the following steps: Information of a non-volatile memory cell is copied into a volatile memory cell in a reading step. The non-volatile memory cell and the volatile memory cell are comprised by a memory circuit. The memory cell array comprises at least one such memory circuit.

In one embodiment, the reading step includes generating a measuring signal depending on a parameter of the non-volatile memory cell. A bit signal is generated by a comparator depending on a selective comparison of the measuring signal with one of several threshold values of the comparator. The bit signal is delivered to the volatile memory cell.

In one embodiment, the non-volatile memory cell comprises a non-volatile memory element. The parameter of the non-volatile memory cell which the measuring signal depends on may be a resistance value of the non-volatile memory element. The measuring signal is active on the measuring line. The measuring signal is fed to the comparator. The comparator creates a comparator output signal corresponding to the bit signal. The bit signal is fed to an input of a first inverter of the volatile memory cell.

In one embodiment, the information stored in the volatile memory cell is provided directly at a direct output of the circuit arrangement. The provisioning process is performed without any selection by means of an address.

In one embodiment, exactly this information is provided at a data output of the circuit arrangement which, according to an address signal, is read out of the memory cell array.

BRIEF DESCRIPTION OF THE DRAWINGS

The invention will be explained in more detail in the following by means of several exemplary embodiments with the aid of the Figures. Components with the same function and effects have identical reference numerals. Insofar as circuit parts or components are identical in their function, their description will not be repeated in each of the following Figures.

DETAILED DESCRIPTION OF THE DRAWINGS

Figure 1:
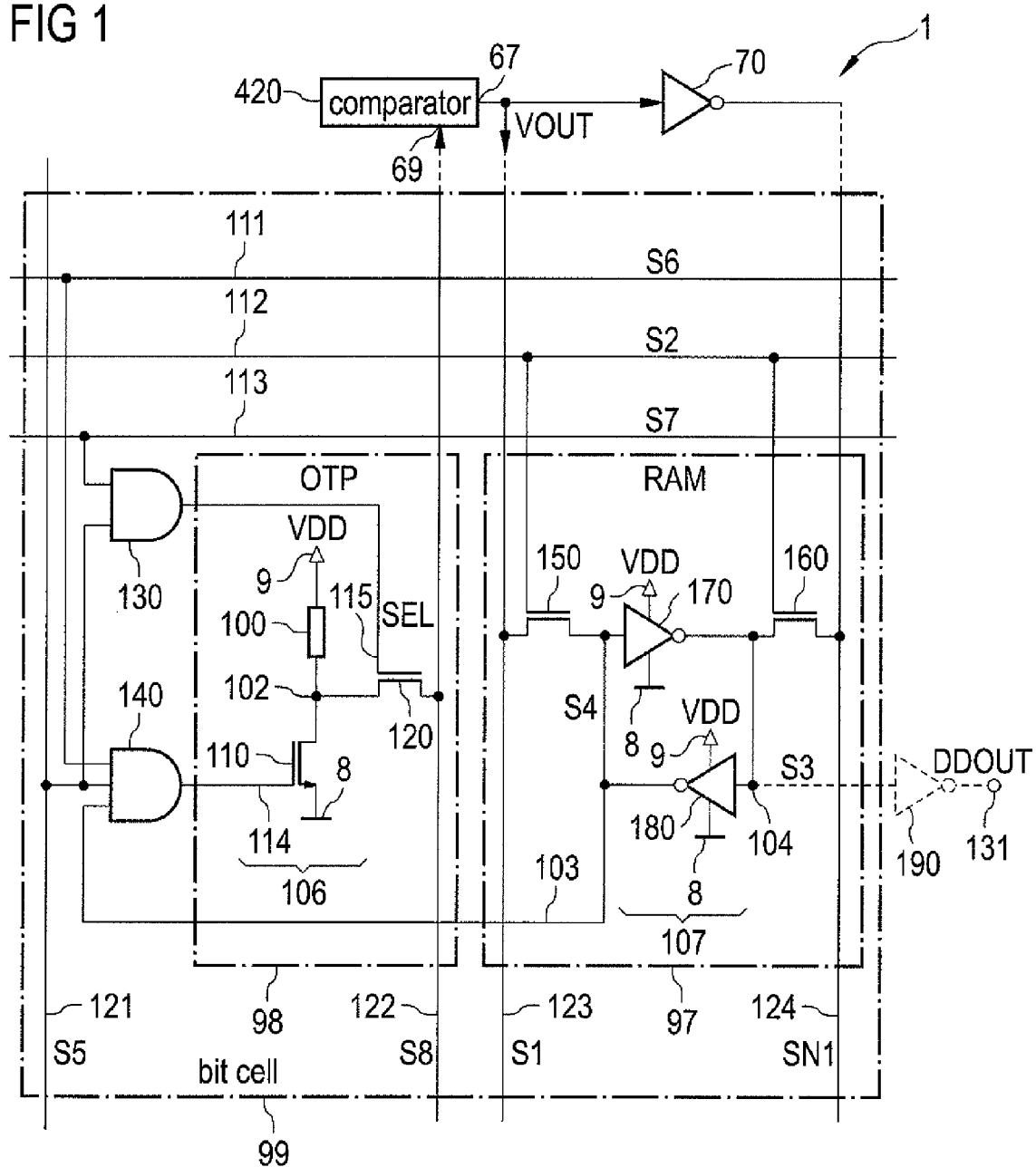
FIG. 1 shows an exemplary embodiment of a memory circuit of a memory cell array of the circuit arrangement according to the invention.
Figure 2:
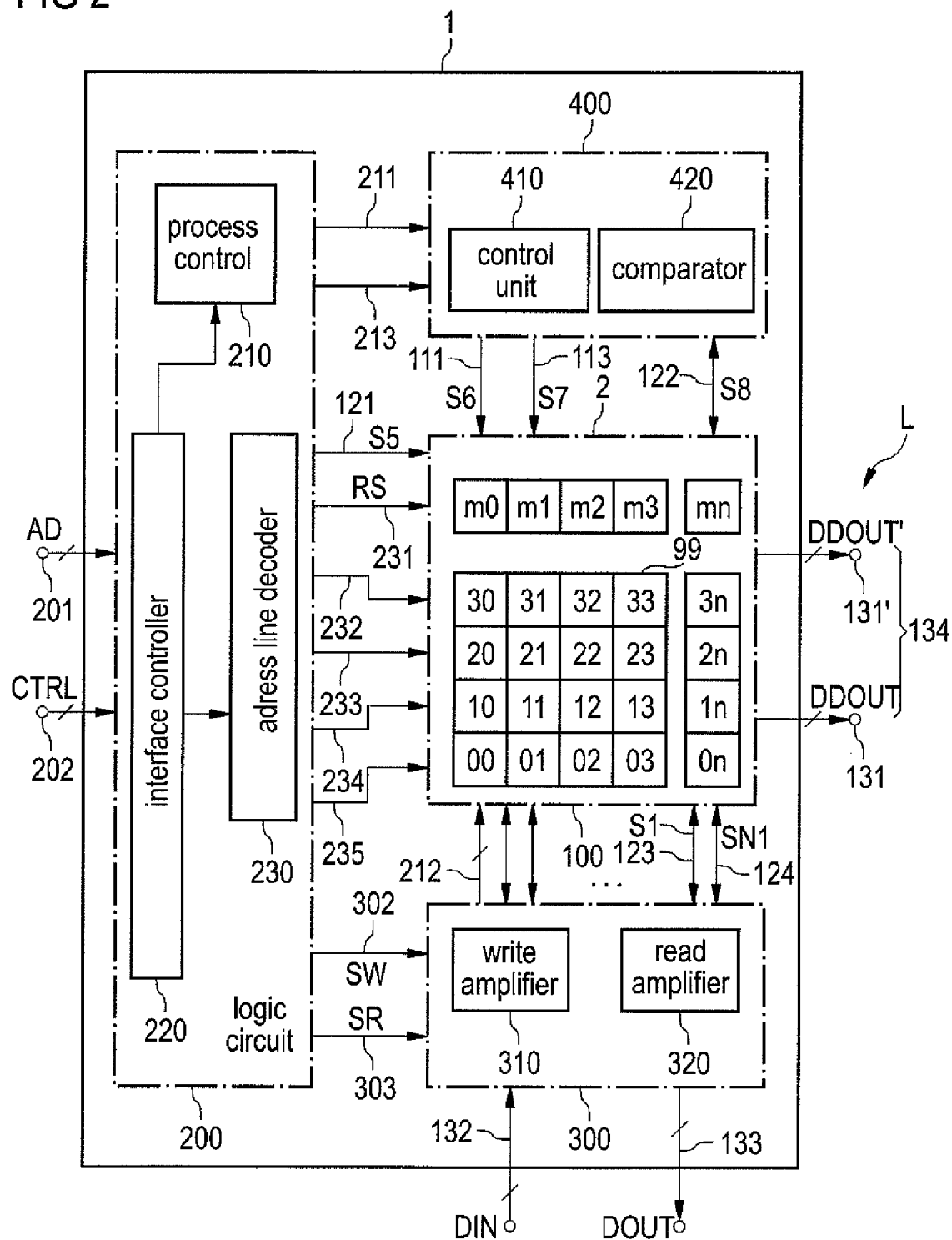
FIG. 2 shows an exemplary embodiment of a circuit arrangement including a memory cell array according to the invention.

FIG. 1 shows an exemplary embodiment of a memory circuit 99 of a memory cell array 2 as shown in FIG. 2. The memory circuit 99 comprises a non-volatile memory cell 98 and a volatile memory cell 97. The non-volatile memory cell 98 comprises a non-volatile memory element 100 as well as a programming transistor 110 and a reading transistor 120. The non-volatile memory element 100 is connected at a terminal to the supply voltage terminal 9 and at an additional terminal via the programming transistor 110 to a reference potential terminal 8. A first current path 106 comprises the non-volatile memory element 100 and the programming transistor 110. A node 102 between the non-volatile memory element 100 and the programming transistor 110 is coupled to a measuring line 122 via the reading transistor 120. A control terminal 114 of the programming transistor 110 is connected to an output of a first logic gate 140. An output of a second logic gate 130 is connected to a control terminal 115 of the reading transistor 120. A first input of the second logic gate 130 is connected to a loading line 113 and a second input of the second logic gate 130 is connected to a column line 121. A first input of the first logic gate 140 is connected to a programming line 111, a second input of the first logic gate 140 is connected to the column line 121 and a third input of the first logic gate 140 is connected to the volatile memory cell 97 via a coupling line 103. The first and second logic gates 130, 140 are each realized as an AND gate.

The volatile memory cell 97 has first and second inverters 170, 180 which each are inserted between the supply voltage terminal 9 and the reference potential terminal 8. Thus, the volatile memory cell 97 is inserted in a second current path 107. A bit line 123 is coupled to an input of the first inverter 170 via an address transistor 150. An output of the first inverter 170 is coupled to an input of the second inverter 180 and by means of an additional address transistor 160 with an inverted bit line 124. An output of the second inverter 180 is connected to the input of the first inverter 170 and, via the coupling line 103, to the third input of the first logic gate 140. A node 104 between the output of the first inverter 170 and the input of the second inverter 180 is coupled to a direct output 131 of the circuit arrangement 1 via a third inverter 190. A control input of the address transistor 150 and a control input of the additional address transistor 160 are connected to a read/write line 112. A circuit arrangement 1 comprises the memory circuit 99 as well as a comparator 420. The measuring line 122 is coupled to a comparator input 69 of the comparator 420. A comparator output 67 of the comparator 420, however, is coupled to the bit line 123. The circuit arrangement 1 has an additional inverter 70 which is inserted between the comparator output 67 and the inverted bit line 124.

By way of example, storing an item of information in the volatile memory cell 97 comprises the following steps in the present embodiment: A bit signal S1 which is active on the bit line 123 is fed to the input of the first inverter 170 if the address transistor 150, depending on the read/write signal S2 which is active on the read/write line 112, is switched so as to be in the conducting state. Likewise, an additional bit signal SN1 which is inverse to the bit signal S1 and is provided on the inverted bit line 124 is fed to the input of the second inverter 180 via the additional address transistor 160 if the additional address transistor 160 is switched so as to be in the conducting state depending on the read/write signal S2. At the node 104 between the first and second inverters 170, 180, a data signal S3 is active which is fed to the direct output 131 via the third inverter 190. Hence, a direct output signal DDOUT applied to the direct output 131 is a signal which is inverse to the data signal S3. If the two address transistors 150, 160 are blocked again, the information in the volatile memory cell 97 will be kept stored in a self-locking way due to the feedback arrangement of the two inverters 170, 180.

Programming the non-volatile memory elements 100 comprises the following steps, for instance: A transfer signal S4 is provided by the second inverter 180 on its output side and is fed to the third input of the first logic gate 140. A column signal S5 is active on the column line 121 and a programming signal S6 is active on the programming line 111. The transfer signal S4, the column signal S5 and the programming signal S6 are fed to the three inputs of the first logic gate 140. If the three signals S4, S5, S6 have the logic value one, the programming transistor 110 will be switched to the ON state. The loading signal S7 exhibits the logic value 0, so that the reading transistor 120 is switched so as to be blocked during the programming process. Due to the programming transistor 110 being switched to the ON state, a current with a certain value flows through the first current path 106 and hence through the non-volatile memory element 100, so that the non-volatile memory element 100 will be programmed. The non-volatile memory element 100 is realized as a programmable resistor. Due to the current flowing through the non-volatile memory element 100, its resistance is changed irreversibly so that the non-volatile memory element 100 has a high resistance value in the case of programming.

Reading the non-volatile memory cell 98 comprises the following steps, for instance: The column signal S5 and the loading signal S7 are fed to the second logic gate 130. If the column signal S5 and the loading signal S7 have the logic value one, the output of the second logic gate 130 also has a logic level one, so that the reading transistor 120 is switched to the ON state. Thus, the node 102 between the non-volatile memory element 100 and the programming transistor 110 is connected to the measuring line 122. This in turn has the effect that a measuring signal S8 is active on the measuring line 122. The measuring signal S8 is fed to a comparator input 69 of the comparator 420 which compares the measuring signal S8 with a threshold value. In this way the non-volatile memory element 100 is compared with a reference resistance value which can be adjusted in the comparator 420. The comparator 420 provides a comparator output signal VOUT on the comparator output 67 which corresponds to the bit signal S1. The additional inverter 70 generates the additional bit signal SN1 from the comparator output signal VOUT. Before the programming process, the non-volatile memory element 100 has a low resistance value which is smaller than the reference resistance value. A programmed memory element 100 has a resistance value which is higher than the reference resistance value. Due to these differences in resistance, the comparator 420 is able to evaluate the programming state of the non-volatile memory element 100 and hence of the non-volatile memory cell 98.

In one embodiment, the control inputs of the address transistors 150, 160 are directly connected to the read/write line 112. The address transistors 150, 160 can thus be switched in one mode of operation so as to be simultaneously in the ON state and in a further mode of operation so as to be simultaneously in the OFF state.

FIG. 2 shows an exemplary embodiment of a circuit arrangement 1 comprising a memory cell array 2, a logic circuit 200, a first peripheral circuit 300 and a second peripheral circuit 400. The memory cell array 2 comprises a two-dimensional matrix with a first number M+1 of rows corresponding to the same number M+1 of words. One word corresponds to a row of the memory cell array 2. Those memory circuits are referred to as one word which are collectively read out with one address. The memory cell array 2 comprises the first number M+1 of rows as well as a second number N+1 of columns. In FIG. 2, the first number is 5 and the second number also 5, so that the memory cell array contains 25 memory circuits. One of the 25 memory circuits of the memory cell array 2 comprises the memory circuit 99 shown in FIG. 1.

The circuit arrangement 1 comprises an address input 201 and a control input 202, which are connected to two inputs of the logic circuit 200, as well as a data input 132 connected to the first peripheral circuit 300. The logic circuit 200 comprises a process control 210 (a Finite State Machine) and an interface controller 220 as well as an address line decoder 230 with line driver units. The logic circuit 200 is connected to the first number M+1 of rows of the memory cell array 2 via M+1 row lines 231 to 235. The logic circuit 200 is connected via the column line 121 to the memory cell array 2. The logic circuit 200 is coupled to the first programming circuit 300 by means of a write line 302 and a read line 303. Further, the logic circuit 200 is connected to the second peripheral circuit 400 via a programming line 211 and a loading line 213.

The first peripheral circuit 300 comprises a write amplifier 310 and a read amplifier 320. The first peripheral circuit 300 is connected to the data input 132 and to a data output 133 of the circuit arrangement 1. The second number N+1 of bit lines 123 connect the second number N+1 of columns of the memory cell array 2 to the first peripheral unit 300. Likewise, the second number N+1 of inverted bit lines 124 connect the first peripheral circuit 300 to the second number of N+1 columns of the memory cell array 2. The first peripheral circuit 300 is connected to the memory cell array 2 via a write/read line 212.

A memory cell 99 of the memory cell array 2 is connected to the direct output 131 of the circuit arrangement 1. At least one additional memory cell 99 of the memory cell array 2 is connected to at least one additional direct output 131' of the circuit arrangement 1. A direct output bus 134 comprises the direct output 131 and the at least one additional direct output 131'. The direct output bus 134 comprises a number of L lines.

The second peripheral circuit 400 comprises a control unit 410 and the comparator 420. The second peripheral circuit 400 is connected via the programming line 111, the loading line 113 and the measuring line 122 to the memory cell array 2. The inverted bit line 124 exhibits a signal which is complementary to the signal of the bit line 123. An address signal AD is fed to the address input 201. The control input 202 is supplied with a control signal CTRL comprising the number of clock signals and logic signals required for the driving of the circuit arrangement 1. At the data input 132, the circuit arrangement 1 is supplied with a data input signal DIN including the information to be stored. The data output 133 provides a data output signal DOUT. The output 131 delivers the direct output signal DDOUT and the at least one additional direct output 131' delivers at least one additional direct output signal DDOUT'. Thus, the direct output bus 134 provides the number L of direct output signals DDOUT, DDOUT'.

For the execution of instructions concerning the volatile memory cells 97, addresses are decoded in the address line decoder 230 in order to be able to write the information in one of the M+1 rows of the memory cell array 2 or to read it out from it, respectively. To this end, the logic circuit 200 applies a row signal RS to one of the M+1 lines 231 to 235. The read amplifier 320 is used to convert the information, which is stored in the volatile memory cells 97, to the data output signal DOUT. The write amplifier 310 serves for storing the information contained in the data input signal DIN in the volatile memory cells 97. All bits of one word are read or written at the same time. The number of write amplifiers 310 and read amplifiers 320 therefore equals the number N+1, which is the number of bits per word.

The information stored in the volatile memory cells 97 is permanently and directly provided via the direct output 131 and the additional direct output 131' in the form of the direct output signal DDOUT and the additional direct output signal DDOUT'. The provisioning on the direct output 131 and the additional direct output 131' is performed in this case without using a read amplifier or a comparator. In the process, the information is delivered at the direct output 131 and the additional direct output 131' in the form of the direct output signal DDOUT and the additional direct output signal DDOUT', respectively; this occurs after a loading signal S7 by which the information is transferred from the non-volatile memory cells 98 to the volatile memory cells 97. In doing so, information about the defined number L of volatile memory cells 97 can be made available.

For access to the non-volatile memory cells 98, the process control 210 provides instructions on the programming line 211, the loading line 213 and the column line 121, which are generated depending on a clock signal. The instructions for loading and programming are processed serially without the use of the address line decoder 230. In case of a programming instruction provided on the loading line 213 of the logic circuit 200 of the second peripheral circuit 400, the information stored in the volatile memory cells 97 is stored in the respective non-volatile memory cell 98. To this end, the connecting line 103 is inserted between the volatile memory cell 97 and the non-volatile memory cell 98 in each of the memory cells 99.

For the loading function, the logic state of the non-volatile memory cell 98 is evaluated: The latter may be unprogrammed or programmed. To this end, the comparator 420 with several changeable threshold values is used. Via the measuring signal S8, a single non-volatile memory element 100 is connected to the comparator input 69 of the comparator 420. The result of the comparison by the comparator 420 is provided at the comparator output 67 and stored in the volatile memory cell 97 of the corresponding memory circuit 99. The comparator 420 compares the resistance of the non-volatile memory element 100 with various reference resistances. A resistance value A is defined with which the non-volatile memory element 100 is considered as programmed in the application. The non-volatile memory element 100 is compared with this resistance value A and a higher resistance value B. If the resistance value of the programmed non-volatile memory element 100 is higher than the resistance value B, it may be assumed that the resistance of the non-volatile memory element 100 will be larger than the resistance value A despite possible fluctuations of the resistance during the lifetime of the circuit arrangement 1. Throughout the specified lifetime, the non-volatile memory element 100 will be reliably identified as programmed.

It is also possible to measure the resistance value of the unprogrammed non-volatile memory element 100 with the comparator 420 without damaging the non-volatile memory element 100. If the resistance of the non-volatile memory element 100 is smaller than a defined resistance value, it may be assumed that the non-volatile memory element 100 can be successfully programmed after the test. This test may be used if the non-volatile memory element 100 is not programmed until the application. Unprogrammed non-volatile memory elements 100 having a resistance which is too large can be identified early on and rejected in this way. There is one comparator 420 in the circuit arrangement 1; the individual non-volatile memory elements 100 are serially evaluated by means of the comparator 420 and uploaded into the volatile memory cells 97.

The circuit arrangement 1 advantageously delivers and receives solely digital signals. The analog measurements are performed by the comparator 420 in the circuit arrangement 1.

As the individual memory circuits 99 include both the non-volatile memory cell 98 and the volatile memory cell 97, it is advantageously possible to jointly utilize the logic circuit 200 for both parts. The non-volatile memory cells 98 correspond to a memory cell which can be programmed once, in short OTP, and the volatile memory cells 97 conform to a random access memory, in short RAM.

The desired information is stored in the volatile memory cell 97 prior to programming. In this way, the entire system in which the circuit arrangement 1 is implemented can be evaluated first with the information of the volatile memory cells 97. If the information is correct, it will be advantageously and directly programmed into the associated non-volatile memory cells 98 from the volatile memory cells 97 of the individual memory circuits 99.

While the information of the non-volatile memory cell 98 is read, the information is stored in the attendant volatile memory cell 97. Therefore, the information is read out of the non-volatile memory cells 98 only once when the supply voltage of the system is switched on. A microcontroller of a higher-ranking system may then read the information out of the volatile memory cells 97. The required access times correspond to a standard RAM component and are advantageously significantly shorter than the access times during reading the non-volatile memory cells 98. This is why higher clock rates are allowable for reading the volatile memory cells 97 than for reading the non-volatile memory cells 98.

In an alternative design variant, a comparator 420 is provided for each data bit of a word. As an alternative, a separate comparator 420 is realized for each memory circuit 99.

In an alternative embodiment, one row of the memory cell array 2 can also store the information of several words. As a word is read out with one address, the various words of a line are associated with different addresses. To this end, the circuit arrangement 1 comprises an additional address decoding device.

In an alternative embodiment, several memory cells of the memory cell array 2 are realized like the memory circuit 99 shown in FIG. 1 in each case. In a preferred embodiment each of the memory cells of the memory cell array 2 is designed like the memory circuit 99 shown in FIG. 1 in each case.

Figure 3:
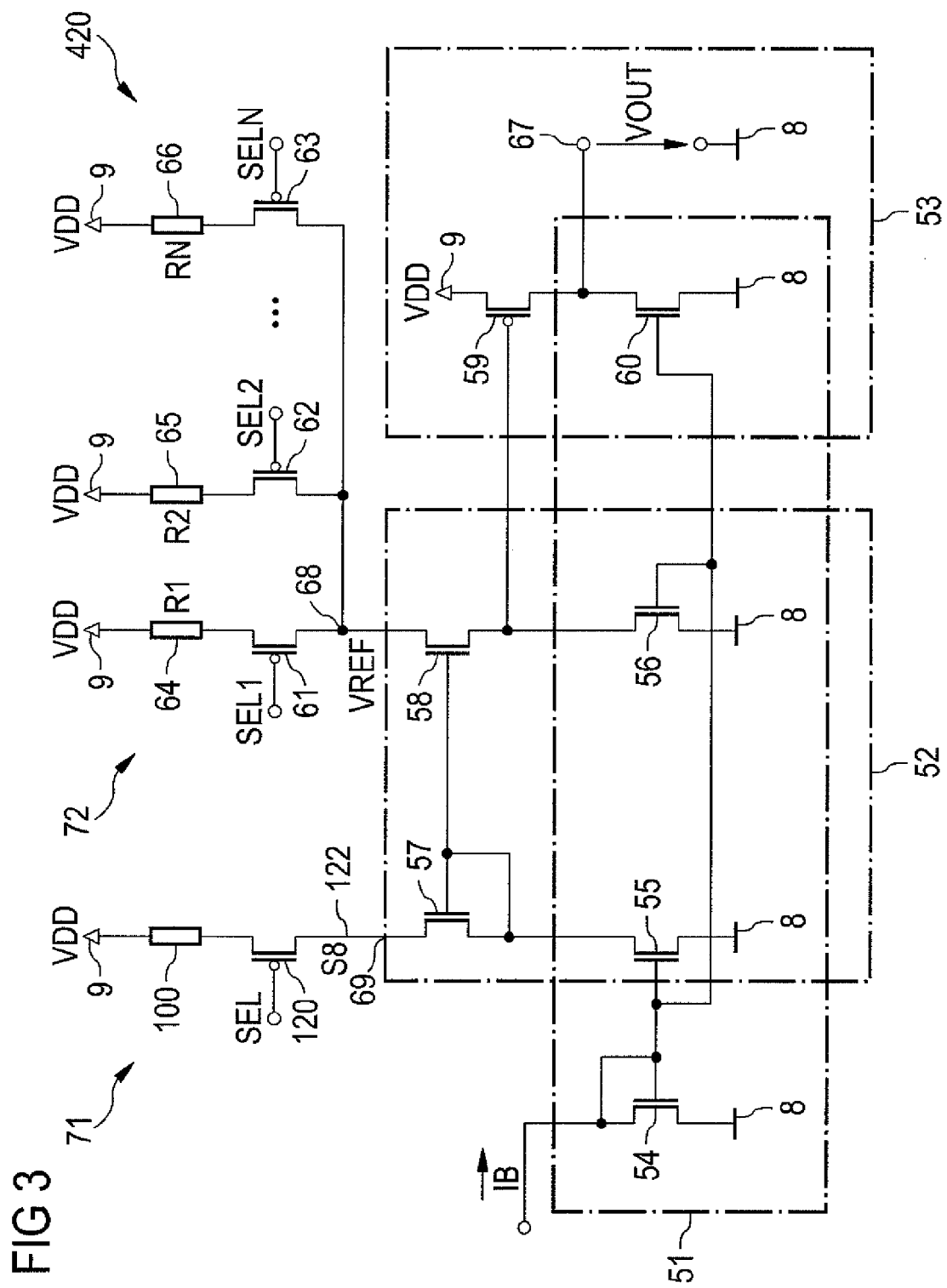
FIG. 3 shows an exemplary embodiment of a comparator of the circuit arrangement according to the invention.

FIG. 3 shows an exemplary embodiment of the comparator 420. The comparator 420 can be used in the circuit arrangement 1 according to FIGS. 1 and 2. The comparator 420 may be referred to as a multilevel comparator. The comparator 420 comprises first and second current mirrors 51, 52 as well as an amplifier 53. The first current mirror 51 comprises first and second transistors 54, 60 as well as first and second load transistors 55, 56. A first terminal of the first and second transistors 54, 60 as well as a first terminal of the first and second load transistors 55, 56 is connected to the reference potential terminal 8. A second terminal of the first transistor 54 is connected to the control terminals of the first and second transistors 54, 60 as well as of the first and the second load transistors 55, 56. The second current mirror 52 comprises the first and second load transistors 55, 56 as well as third and fourth transistors 57, 58. A control terminal of the third transistor 57 is connected to a first terminal of the third transistor 57 and to a control terminal of the fourth transistor 58. The first terminal of the third transistor 57 is connected to a second terminal of the first load transistor 55. Likewise, the first terminal of the fourth transistor 58 is connected to a second terminal of the second load transistor 56.

The comparator input 69 is connected to a second terminal of the third transistor 57. The comparator input 69 in turn is connected to the measuring line 122. Hence, the measuring line 122 is connected to a second terminal of the third transistor 57. FIG. 3 exemplarily shows that the reading transistor 120 can be connected by means of the measuring line 122, wherein the reading transistor 120 couples the measuring line 122 to the non-volatile memory element 100. The non-volatile memory element 100 is connected to the supply voltage terminal 9 at one terminal. The amplifier 53 comprises the second transistor 60 and a fifth transistor 59. A node between the second load transistor 56 and fourth transistor 58 is connected to a control terminal of the fifth transistor 59. The second and fifth transistors 59, 60 are inserted in series arrangement between the supply voltage terminal 9 and the reference potential terminal 8. A node between the second and fifth transistors 59, 60 is connected to the comparator output 67. The bit line 123 is connected to the comparator output 67.

The comparator 420 comprises sixth, seventh and eighth transistors 61 to 63 as well as first, second and third resistors 64 to 66 which are used as reference resistors. A second terminal of the fourth transistor 58 is connected to a node 68. The node 68 is connected to the supply voltage terminal 9 via a series connection comprising the sixth transistor 61 and first resistor 64. Likewise, the node 68 is connected to the supply voltage terminal 9 via a series connection comprising the seventh transistor 62 and second resistor 65. In a corresponding manner, the node 68 is connected to the supply voltage terminal 9 via an additional series connection comprising the eighth transistor 63 and the third resistor 66.

The first terminal of the first transistor 54 is supplied with a bias current IB. The first current mirror 51 serves for adjusting the currents in the second transistor 60 as well as in the first and second load transistors 55, 56. Thus, the first current mirror 51 mirrors the bias current IB in the second current mirror 52. The current in a first branch 71 of the second current mirror 51 equals the current in a second branch 72 of the second current mirror 52. The measuring signal S8, which is fed to the comparator input 69 and hence the third transistor 57, can be tapped at the measuring line 122. A reference voltage VREF is established at node 68. The resistance values of the three resistors 64, 65, 66 differ from each other. By means of the sixth to eighth transistors 61 to 63, one of the three resistors 64 to 66 is inserted in the second branch 72, so that the resistance of the non-volatile memory element 100 is compared with various resistance values. According to the resistance value of the non-volatile memory element 100 and the resistance value of the first, second or third resistors 64, 65, 66, the measuring signal S8 and the reference voltage VREF differ from each other. The reading transistor 120 corresponds to the sixth, seventh and eighth transistors 61 to 63, so that the voltage drops across these transistors are compensated. The amplifier 53 is provided for picking up the voltage which can be tapped at the node between the second load transistor 56 and the fourth transistor 58. The amplifier 53 toggles in one of the two directions corresponding to the voltage drops in the second current mirror 52. A comparator output signal VOUT of the comparator 420 can be tapped at the comparator output 67. The first, second, third and fourth transistors 54, 57, 58, 60 as well as the first and second load transistors 55, 56 are designed as N-channel MOSFETs. The fifth, sixth, seventh and eighth transistors 59, 61, 62, 63 are realized as P-channel MOSFETs. Likewise, the reading transistor 120 is designed as a P-channel MOSFET.

It is advantageously possible to choose by means of the sixth to eighth transistors 61 to 63 which of the three resistors 64 to 66 the non-volatile memory element 100 is compared with.

In an alternative embodiment, additional series connections which comprise an additional transistor and an additional resistor are inserted between the node 68 and the supply voltage terminal 9.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A circuit arrangement having a memory cell array comprising a plurality of memory circuits, each of the plurality of memory circuits comprising:
   a non-volatile memory cell which is inserted in a first current path between a supply voltage terminal and a reference potential terminal and comprises a non-volatile memory element;
   a volatile memory cell which is inserted in a second current path between the supply voltage terminal and the reference potential terminal and comprises a first inverter, a second inverter in feed-back arrangement with the first inverter, and an address transistor inserted between an input of the first inverter and a bit line, the volatile memory cell being coupled to the non-volatile memory cell for reading and programming the non-volatile memory element;
   a reading transistor coupling the non-volatile memory cell to a measuring line; and
   a connection line between the volatile memory cell and the non-volatile memory cell such that, in cases of a program instruction, information stored in the volatile memory cell is stored in the non-volatile memory cell;
   wherein the circuit arrangement further comprises a comparator coupled between the non-volatile memory cell and the volatile memory cell so that an input of the comparator is connected to the measuring line and an output of the comparator is connected to the bit line, the comparator holding several threshold values and being configured to selectively compare a measuring signal of the measuring line with one of the several threshold values.

2. The circuit arrangement according to claim 1, wherein the volatile memory cell comprises an additional address transistor inserted between an input of the second inverter and an inverted bit line.

3. The circuit arrangement according to claim 1, further comprising:
a direct output connected to the volatile memory cell so that a data signal which can be tapped in the volatile memory cell, or a signal inverted thereto, is continuously applied to the direct output.

4. The circuit arrangement according to claim 1, wherein the non-volatile memory cell comprises a programming transistor inserted in the first current path in serial arrangement with the non-volatile memory element.

5. The circuit arrangement according to claim 3, wherein the memory circuit comprises:
a first logic gate which on the input side, is connected to a control line for supplying a programming signal, a column line for supplying a column signal and, via the connecting line, to the volatile memory cell for supplying the data signal or a transfer signal inverted thereto, and on the output side, is connected to a control terminal of the programming transistor.

6. The circuit arrangement according to claim 5, wherein the memory circuit comprises:
a second logic gate which, on the input side, is connected to the column line for supplying the column signal and to a loading line for supplying a loading signal, and the reading transistor which couples a node between the non-volatile memory element and the programming transistor to the measuring line and is connected on a control input to an output of the second logic gate.

7. The circuit arrangement according to claim 6, wherein the comparator output is coupled to the inverted bit line via an additional inverter.

8. The circuit arrangement according to claim 1, wherein the threshold values of the comparator are threshold values which can be predefined.

9. The circuit arrangement according to claim 1, wherein the non-volatile memory cell and the volatile memory cell can be driven by a shared logic circuit.

10. A method for operating a circuit arrangement having a memory cell array comprising a plurality of memory circuits, including transferring an item of information of a non-volatile memory cell to a volatile memory cell in a reading step, with the non-volatile memory cell and the volatile memory cell each being comprised of the memory cell array, wherein the reading step comprises:
providing a measuring signal depending on a parameter of the non-volatile memory cell;
providing a bit signal by a comparator depending on a selective comparison of the measuring signal with one of several threshold values of the comparator;
providing the bit signal to the volatile memory cell; and
storing, in the case of a programming instruction, information stored in the volatile memory cell in the non-volatile memory cell via a connecting line between the volatile memory cell and the non-volatile memory cell in each of said plurality of memory circuits.

11. A circuit arrangement comprising a memory cell array with at least one memory circuit, wherein the at least one memory circuit comprises:
a non-volatile memory cell which is inserted in a first current path between a supply voltage terminal and a reference potential terminal and comprises a non-volatile memory element;
a volatile memory cell which is inserted in a second current path between the supply voltage terminal and the reference potential terminal and comprises a first inverter, a second inverter in feed-back arrangement with the first inverter, and an address transistor inserted between an input of the first inverter and a bit line, the volatile memory cell being coupled to the non-volatile memory cell for reading and programming the non-volatile memory element; and
a reading transistor coupling the non-volatile memory cell to a measuring line;
wherein the circuit arrangement further comprises a comparator coupled between the non-volatile memory cell and the volatile memory cell so that an input of the comparator is connected to the measuring line and an output of the comparator is connected to the bit line, the comparator holding several threshold values and being configured to selectively compare a measuring signal of the measuring line with one of the several threshold values;
wherein the non-volatile memory cell comprises a programming transistor inserted in the first current path in serial arrangement with the non-volatile memory element; and
wherein the memory circuit comprises:
a first logic gate which on the input side, is connected to a control line for supplying a programming signal, a column line for supplying a column signal and, via a coupling line, to the volatile memory cell for supplying the data signal or a transfer signal inverted thereto, and on the output side, is connected to a control terminal of the programming transistor.

* * * * *